(12) United States Patent
Xu et al.

(10) Patent No.: US 10,144,296 B2
(45) Date of Patent: Dec. 4, 2018

(54) GATE DRIVER WITH TEMPERATURE COMPENSATED TURN-OFF

(71) Applicant: Ford Global Technologies, LLC, Dearborn, MI (US)

(72) Inventors: Fan Xu, Novi, MI (US); Shuitao Yang, Dearborn Heights, MI (US); Yan Zhou, Canton, MI (US); Lihua Chen, Farmington Hills, MI (US); Mohammed Khorshed Alam, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 63 days.

(21) Appl. No.: 15/366,226

(22) Filed: Dec. 1, 2016

(65) Prior Publication Data

US 2018/0154784 A1    Jun. 7, 2018

(51) Int. Cl.
*B60L 11/18* (2006.01)
*H02M 3/158* (2006.01)
*H02M 7/537* (2006.01)
*H02M 1/08* (2006.01)
*H02M 1/15* (2006.01)
*H02M 7/5387* (2007.01)
*H03K 17/16* (2006.01)
*H02M 1/00* (2006.01)
*H02M 1/32* (2007.01)
*H02M 1/34* (2007.01)

(52) U.S. Cl.
CPC ....... *B60L 11/1812* (2013.01); *B60L 11/1816* (2013.01); *H02M 1/08* (2013.01); *H02M 1/15* (2013.01); *H02M 3/158* (2013.01); *H02M 7/537* (2013.01); *H02M 7/53871* (2013.01); *H03K 17/166* (2013.01); *B60L 2210/10* (2013.01); *B60L 2210/40* (2013.01); *H02M 2001/0054* (2013.01); *H02M 2001/327* (2013.01); *H02M 2001/342* (2013.01)

(58) Field of Classification Search
CPC ............................ H03K 17/166; H02M 3/158
See application file for complete search history.

(56) References Cited

U.S. PATENT DOCUMENTS

| 2012/0019184 | A1 | 1/2012 | Niizuma | |
| 2014/0049867 | A1* | 2/2014 | Kikuchi | H03K 17/0828 361/87 |
| 2016/0099665 | A1* | 4/2016 | Chen | H02M 1/08 318/400.27 |

(Continued)

FOREIGN PATENT DOCUMENTS

| JP | 2008067593 A | * | 3/2008 | |
| JP | WO 2013054465 A1 | * | 4/2013 | H03K 17/06 |

*Primary Examiner* — Thienvu Tran
*Assistant Examiner* — Pinping Sun
(74) *Attorney, Agent, or Firm* — David B. Kelley; Brooks Kushman P.C.

(57) ABSTRACT

A vehicle powertrain includes a switch configured to provide a drive current to an electric machine and coupled with a diode array and a gate driver. The gate driver may be configured to, in response to a voltage across the array exceeding a threshold while providing the drive current in a presence of a turn-off request, confine operation of a resistive switch to a linear region to decrease a rate of change of the drive current proportional to the voltage.

20 Claims, 8 Drawing Sheets

(56) References Cited

U.S. PATENT DOCUMENTS

2016/0191042 A1    6/2016  Lizama et al.
2017/0040802 A1*   2/2017  Hopperdietzel ..... G01R 15/183
2018/0191339 A1*   7/2018  Cyr ........................ H02M 1/34

* cited by examiner

GATE DRIVER WITH TEMPERATURE COMPENSATED TURN-OFF

TECHNICAL FIELD

This application is generally related to a gate driver for a solid state switch in which temperature feedback from the switch is used to adjust a gate current to change a rate of turn-off.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range and provide a maximum current. The traction battery is alternatively referred to as a high-voltage battery wherein a terminal voltage of a typical traction battery is over 100 Volts DC. However, improved performance of electric machines may be achieved by operating in a different voltage range, typically at voltages greater than the traction battery terminal voltage. Likewise, the current requirements to drive a vehicular electric machine are commonly referred to as high current. Due to the high voltages and high currents typically driving an inductive load, a counter-electromotive force (cemf or back emf) or transient voltage spike may be experienced when a switch disconnects an inductive load from a current source and the field in the coil begins to collapse to maintain the voltage across the inductor.

Also, many electrified vehicles include a DC-DC converter, also referred to as a variable voltage converter (VVC), to convert the voltage of the traction battery to an operational voltage level of the electric machine. The electric machine, which may include a traction motor, may require a high voltage and high current. Due to the voltage, current and switching requirements, a solid state switch such as an Insulated Gate Bipolar junction Transistor (IGBT) is typically used to generate the signals in the power inverter and the VVC.

SUMMARY

A vehicle powertrain includes a switch configured to provide a drive current to an electric machine and coupled with a diode array and a gate driver. The gate driver may be configured to, in response to a voltage across the array exceeding a threshold while providing the drive current in a presence of a turn-off request, confine operation of a resistive switch to a linear region to decrease a rate of change of the drive current proportional to the voltage.

A method of controlling an Insulated Gate Bipolar Junction Transistor (IGBT) of a vehicle powertrain includes, in response to voltage across a diode array of the IGBT exceeding a threshold while providing a drive current in a presence of a turn-off request for the IGBT, limiting operation of a resistive switch that is electrically in parallel with a gate resistor for the IGBT to a linear region to reduce a rate of change of the drive current.

A vehicle includes a power converter including a power switch and a gate driver. The gate driver may be configured to, in response to a voltage across a diode array, coupled with the power switch, dropping below a threshold while providing a current to a load in a presence of a turn-off request, transition a resistive device from a linear region to a saturation region to selectively increase a rate of change of the current proportional to the voltage.

DETAILED DESCRIPTION

Figure 1:
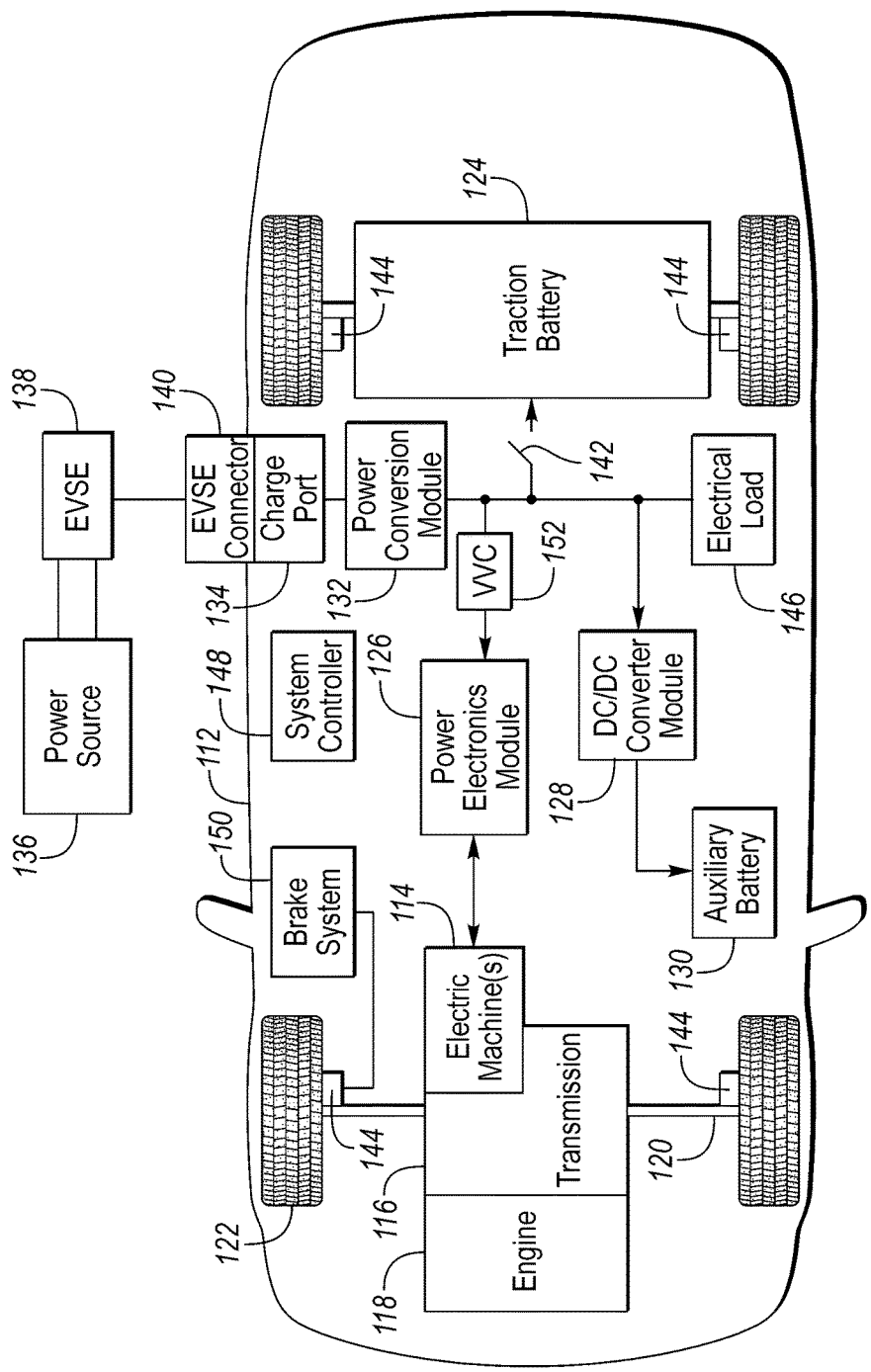
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

When considering an xEV such as an HEV, PHEV, or BEV, operating conditions may vary greatly over the life of the xEV. For example, a power device operating in a powertrain system such as a transistor in a converter, including a DC-DC converter or a DC-AC converter may be operated over a wide temperature range, and thus the power device in the converter may have a junction temperature (Tj) that varies from an extreme low temperature (e.g., −40° C.) to a very high temperature (e.g. 150° C.). As the operating voltage varies, so does a breakdown voltage (VB) of the power device as VB is a function of Tj. Here, a circuit is disclosed that automatically adjusts to the change in device junction temperature to provide increased protection from reverse voltage breakdown of the component. Generally room temperature is 25° C. and a low temperature is any temperature less than room temperature, while a very low temperature is any temperature less than 0° C. (i.e., the temperature that water freezes). Typically, the breakdown voltage of the switch is measured at room temperature (i.e., 25° C.). A breakdown of an IGBT may be specified as a breakdown voltage from collector to emitter with the gate shorted to the emitter (BVces) while limiting the condition associated with the specification. For example, the specification may limit the breakdown conditions to a temperature of 25° C. while a collector current is 1 mA and Vge is 0V. However, during use in a harsh environment, the breakdown voltage BVces may drop by an additional 5% at −25° C. and an additional 7% at −50° C. Therefore, an electric module in a vehicle such as a DC-DC converter or a DC-AC converter may have voltage peaks that are under the breakdown voltage when the Tj is greater than room temperature but may exceed the breakdown voltage at low temperatures. The voltage peaks are based on a gate current magnitude, a rate of change of a current through the switch, and a magnitude of the current. Often the breakdown voltage of a switch is based on the circuit topology and manufacturing process. For a given current capacity, switches having higher breakdown voltages typically have higher costs, and in some instances switches with higher breakdown voltages are not available due to material limitations of the switch. A circuit designer using the switch often desires to operate the switch close to the breakdown voltage without exceeding it. Therefore, to meet the requirements and constraints of the switches, a system is typically designed using a minimum breakdown voltage across the entire temperature range of operation. However, often the switches are only operated at the very low or extreme low temperatures (e.g., −50, −40, −35, −25, −15, or −5) for a brief period time, after which the components heat up (either internally or via the use of an external heater) and the breakdown voltage increases. To reduce costs and improve efficiencies, methods and circuits are disclosed to adjust a gate current of a switch, based on a temperature of the switch, to proportionally adjust a load current when the switch is operated at low and very low temperatures.

Generally, solid state devices (SSD), such as Insulated Gate Bipolar junction Transistors (IGBTs), Metal Oxide Semiconductor Field Effect Transistors (MOSFETs), or Bipolar Junction Transistors (BJTs) are widely used in a variety of automotive and industrial applications, such as electric motor drives, power inverters, DC-DC converters, and power modules. Operation of an IGBT and a MOSFET is voltage controlled, in which the operation is based on a voltage applied to a gate of the IGBT or MOSFET, while operation of a BJT is current controlled, in which the operation is based on a current applied to a base of the BJT. Here, the use of an IGBT will be discussed, however the structure and methods may be applicable to other SSDs, for example, an insulated gate SSD includes both an IGBT and a MOSFET. Operation of an IGBT is controlled by a gate voltage supplied by a gate driver. Conventional gate drivers are typically based on a voltage, greater than a threshold voltage, applied to the IGBT gate with a current limiting resistor, which typically consists of a switchable voltage source and a gate resistor. A low gate resistance would lead to a fast switching speed and low switching loss, but may also cause higher stresses on the semiconductor devices, e.g. over-voltage stresses. Therefore, the gate resistance is selected to seek a compromise between switching loss, switching delay, and stresses. When turning off an IGBT, the gate resistor reduces the current flowing from the gate and thereby increases a shutoff time of the IGBT. Also, the IGBT may not have equal losses during turn-on and turn-off, therefore the use of a gate driver that provides a turn-on resistance that is different from the turn-off resistance may be used.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
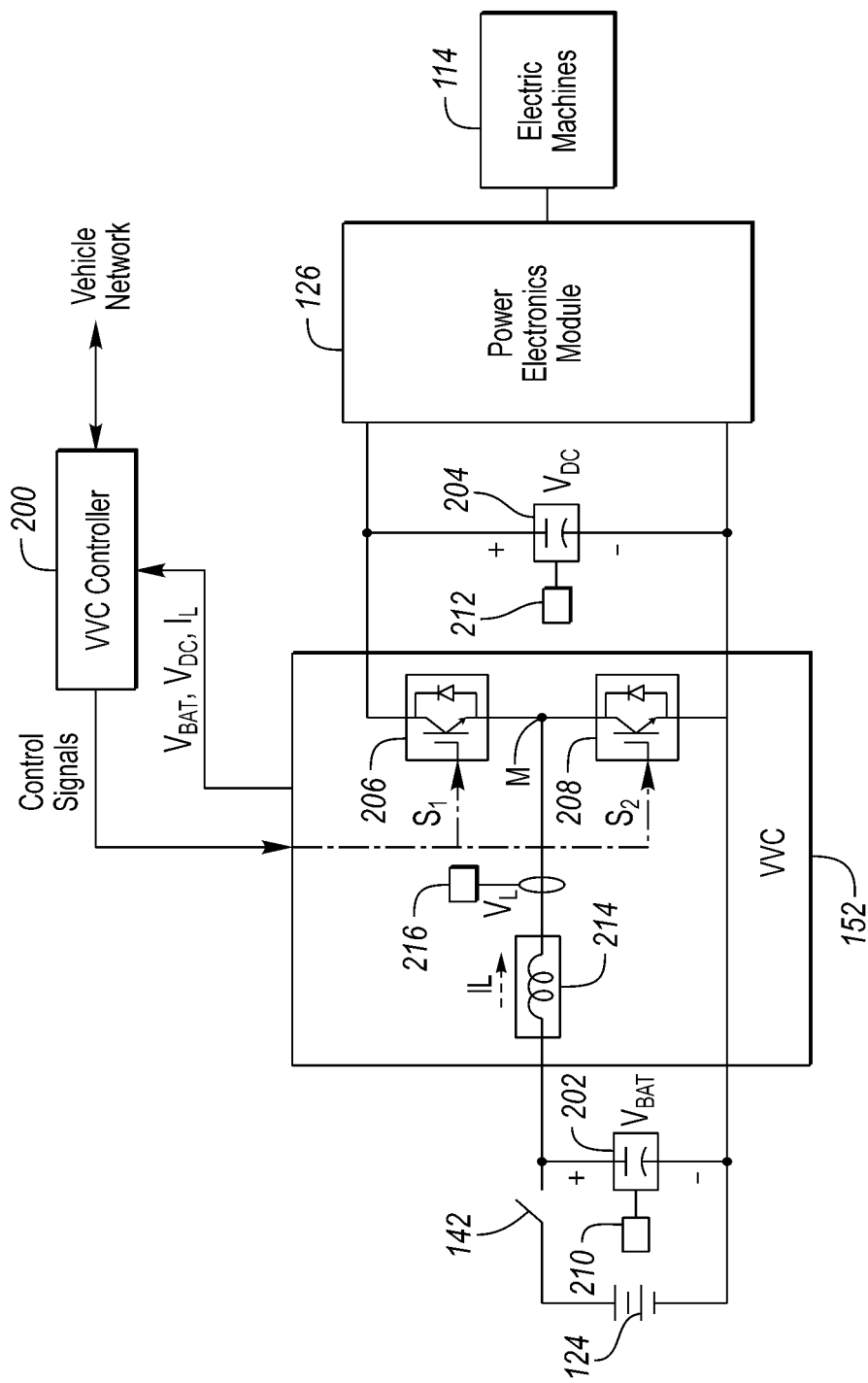
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V_{dc}^*$. The VVC controller 200 may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \qquad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214, often referred to as a boost inductor, may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal (4) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V_{dc}^*$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208). The use of complementary control of the switching devices 206, 208 is desirable to avoid a shoot-through condition in which current flows directly through a high-side switching device 206 and a low-side switching device 208. The high-side switching device 206 is also called a pass device 206 and the low-side switching device 208 is also called a charging device 208.

Figure 5:
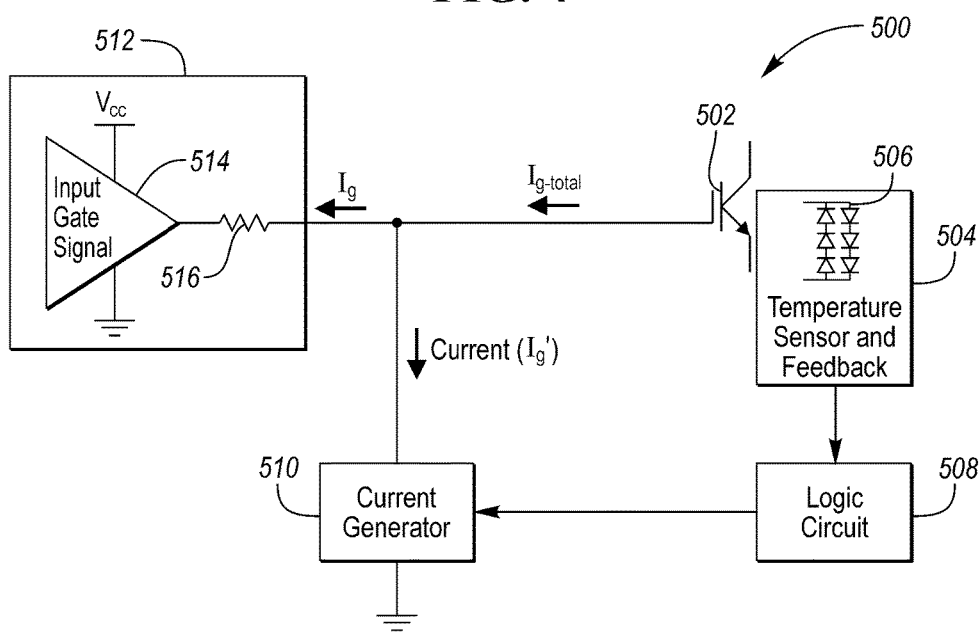
FIG. 5 is a schematic diagram of a gate drive circuit having temperature compensation circuitry.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
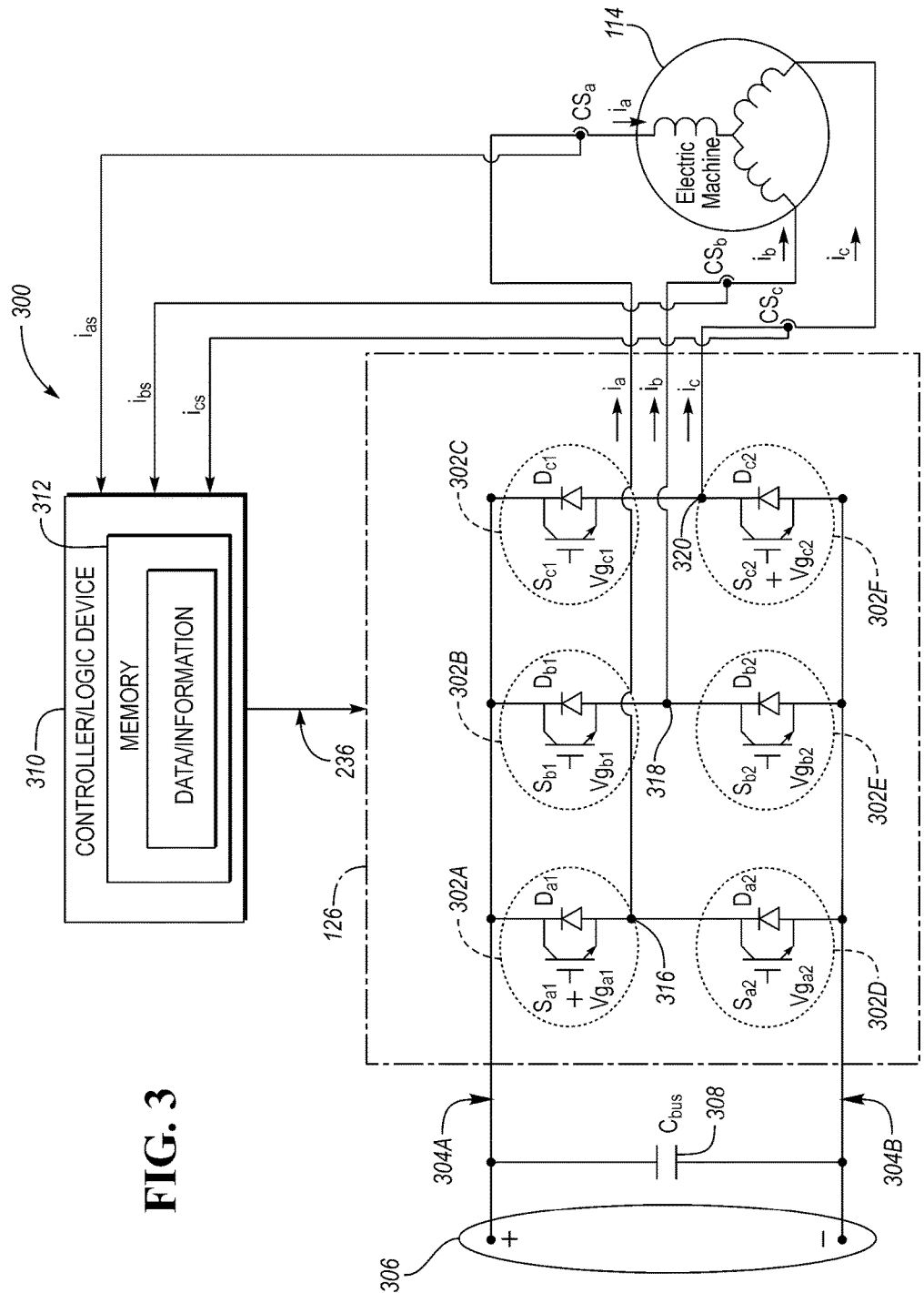
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and is to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{e1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. The top switches are typically referred to as high-side switches (i.e., 302A, 302B, 302C) and the lower switches are typically referred to as low-side switches (i.e., 302D, 302E, 302F). Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 3: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4:
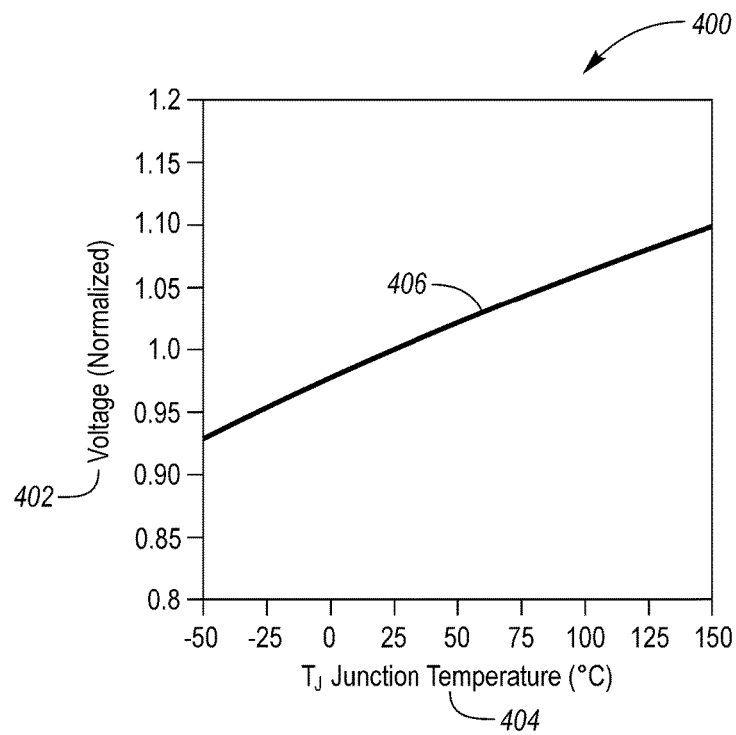
FIG. 4 is a graphical illustration of a normalized breakdown voltage of a solid state switch with respect to a junction temperature of the switch.

FIG. 4 is a graphical illustration 400 of a normalized breakdown voltage 402 of a solid state switch with respect to a junction temperature 404 of the switch. Generally an IGBT has a breakdown voltage across the collector and emitter with the gate shorted with the emitter (BVces). BVces is the voltage at which the reverse-biased body diode breaks down and current starts to flow between the collector and emitter by a process called avalanche multiplication. Typically, BVces is measured at 25° C. and at a collector current of 250 µA. Likewise, for a MOSFET, a breakdown voltage across the drain and source, BVdss, is the voltage at which the reverse-biased body diode breaks down after which a current starts to flow between the source and drain by avalanche multiplication, while the gate and source are shorted together. Likewise, BVdss is measured at 25° C. and at a collector current of 250 µA. A characteristic line 406 of an IGBT of the breakdown voltage (BV) 402 is shown to decrease as Tj 404 decreases. Here, a circuit is disclosed that adjusts a peak voltage in proportion to a change in breakdown voltage 402 such that a power device's peak voltage (Vpeak) under extreme operation conditions is lower than the BV.

During a turn-off transient, a peak voltage of the power device may be higher than the DC-link voltage due to a voltage overshoot or surge voltage. This voltage overshoot (Vsurge) is based on a power loop stray inductance (LS) (e.g., parasitic inductance) and a rate of change of a load current (di/dt) (e.g., when driving an electric machine it is a rate of change of the drive current), such that Vsurge=LS*di/dt. Further, the resistance of most resistive materials, such as copper and aluminum metals and alloys that are used in the device packaging, decrease as the temperature decreases thus increasing the di/dt and increasing Vsurge. The result is that systems are typically designed with an additional guard band to protect for operation at very low temperatures. By designing a system to protect for operation at very low temperatures, additional operational losses may occur at normal operating temperatures. By adjusting the operation based on the current temperature, losses may be minimized.

FIG. 5 is a schematic diagram of an IGBT 502 driven by a gate drive circuit 500 having temperature compensation circuitry. The temperature compensation circuitry adjusts a turn-off gate current to control Vsurge, based on a temperature sensor feedback signal, to avoid the power device voltage breakdown during the xEVs operation at extreme low temperatures. The architecture of the proposed method used to drive an IGBT 502 is shown in FIG. 5 and includes four units: 1) temperature sensor and feedback 504, illustrated as a diode array 506; 2) logic circuit 508; 3) additional an gate current generator 510; and 4) a gate driver 512. The temperature sensor and feedback unit 504 is shown based on a diode array 506 that is sensitive to temperature. The diode array 506 is configured to output a voltage signal (VT) based on a temperature of the IGBT 502. The diode array 506 may be monolithically integrated with the IGBT 502 such that VT is a more accurate indication of the Tj. In another embodiment, the temperature sensor may be a thermistor, coupled with the IGBT, and located within the power module such that it is closely coupled with the IGBT.

Figure 6:
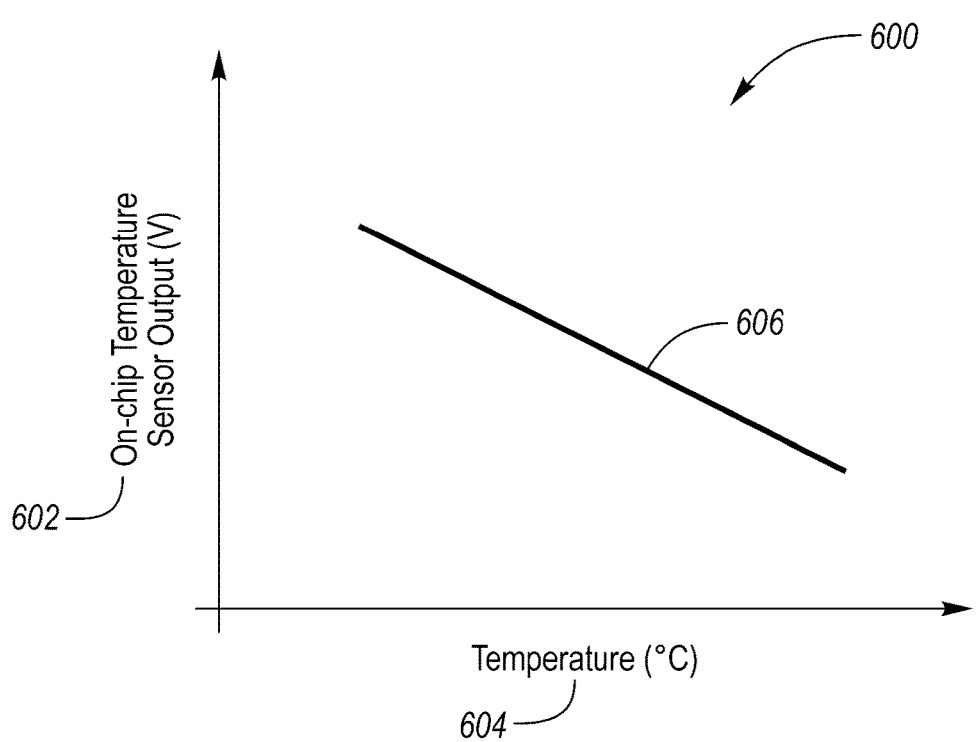
FIG. 6 is a graphical illustration of a voltage across a diode array monolithically integrated with a solid state switch with respect to junction temperature of the switch.

FIG. 6 is a graphical illustration 600 of a voltage 602 across a diode array monolithically integrated with a solid state switch with respect to junction temperature 604 of the switch. The temperature sensor output voltage 602 is shown to decrease along a substantially linear profile 606 as the temperature increases. The substantially linear profile 606 is representative of the operation of a diode array monolithically integrated with a solid state switch such as an IGBT. Referring back to FIG. 5, the temperature sensor and feedback unit 504 is often typical in xEVs powertrain systems, for example, in traction inverter power devices to provide temperature monitoring and over temperature protection. The logic circuit unit 508 receives the signal from the temperature sensor and feedback unit 504 and outputs a control signal (VO) to the current generator unit 510 based on VT. The current generator unit 510 generates an adjustable gate current (Ig') to control Vsurge. The current generator unit 510 may operate independently of the gate driver 512, or may be configured to operate in unison with the gate driver 512. Typically, the gate driver includes a logic circuit 514 such as an inverter or buffer. The logic circuit 514 may utilize switches including MOSFET, BJT transistors, or a combination thereof to drive the gate of the IGBT 502. Typically, the logic circuit 514 drives the IGBT gate through a current limiting gate resistor 516, and the current limiting resistor 516 is sized for worst case operation. Therefore, when the IGBT 502 is operated at extreme low temperatures such that the breakdown voltage of the IGBT 502 is reduced by thermal effects, a gate resistor 516 is selected to protect against a Vsurge exceeding the lower breakdown voltage due to low temperatures. As a result, during normal operation at normal operating temperatures, switching losses may be higher due to the selected gate resistor 516.

Figure 7A:
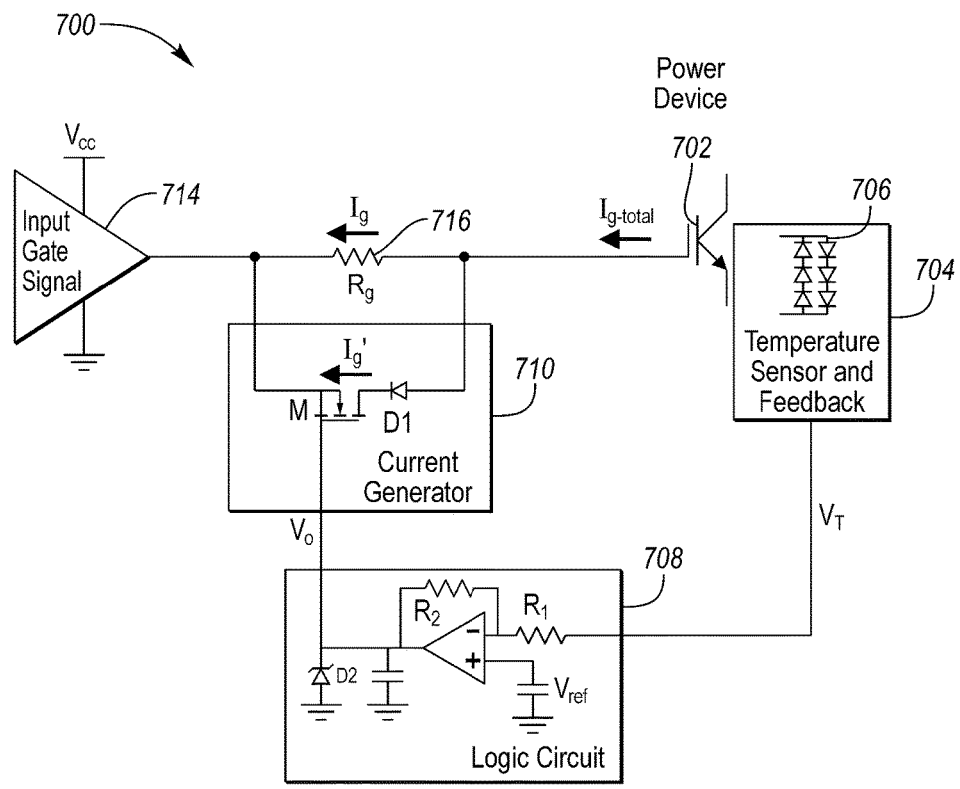
FIG. 7A is a first schematic diagram of a gate drive circuit having temperature compensation circuitry.

FIG. 7A is a first schematic diagram of an IGBT and a gate drive circuit 700 having temperature compensation circuitry. In this embodiment, an IGBT 702 is coupled with a temperature sensor and feedback unit 704 that is based on a diode array 706 that is sensitive to temperature. The diode array 706 is configured to output a voltage signal (VT) based on a temperature, typically the junction temperature Tj, of the IGBT 702. The diode array 706 may be monolithically integrated with the IGBT 702 such that VT provides a more accurate representation of the Tj of the IGBT 702. The temperature sensor 704 outputs a signal to a logic circuit 708 that may be used to buffer, filter, or process the raw signal from the temperature sensor 704, after which the logic circuit 708 may output a signal to drive a current generator 710. The current generator 710 is coupled in parallel with the current limiting gate resistor 716 such that a total gate current flowing from the gate of the IGBT 702 is a sum of the current flowing through the gate resistor 716 ($I_g$) and the current flowing through the current generator 710 ($I_g'$).

A traditional voltage source gate drive circuit includes an external gate resistor Rg 716. Here, during a turn-off transient, the temperature sensor output $V_T$ and a reference voltage Vref are inputs to an operational amplifier configured in an inverting amplifier configuration that is used to generate a control signal $V_O$, in which $V_O$ may be described by equation 1, below:

$$V_O = \frac{R_1 + R_2}{R_1} \cdot V_{ref} - \frac{R_2}{R_1} \cdot V_T \quad (1)$$

The n-channel MOSFET (M) of the current generator 710 may be configured to operate in either the saturation region or the linear region. In the saturation region, the resistance of the channel is specified by a drain to source resistance ($R_{DS(on)}$) In the linear region, the channel is not saturated and thus produces a resistance that changes with an applied voltage. In general, the resistance of a MOSFET operated in the linear region may be expressed by $R=V_{DS}/I_D$ where $V_{DS}$ is the drain-source voltage and $I_D$ is the drain current. Further, $I_D$ is based on device characteristics, a gate to source voltage ($V_{GS}$), a threshold voltage ($V_T$) and $V_{DS}$ when $|V_{Ds}|<<(V_{GS}-V_T)$. The value of the current generator 710, (Ig') is typically determined by the gate voltage of M, which is the generated control signal VO in from equation 1. Here, a controller may limit operation to the linear region such that a resistive channel (channel of the switch in a resistive mode) is coupled in parallel with a gate resistor. Along with operation in the linear region, a MOSFET may be operated in the saturation region. MOSFET performance in the saturation region is such that a drain current is substantially constant with respect to a change in drain to source voltage and the constant drain current value is based on a MOSFET gate voltage. Use of the switch in a saturation mode allows channel control over a wide range of collector to emitter voltages (for an IGBT or BJT) or drain to source voltages for a MOSFET. Also, as operating conditions change and the device temperature changes, it may be necessary to transition from operation in the linear mode to operation in the saturation mode. During the turn-off transient, the gate driver (GD) output drops from high to low but the gate voltage of the IGBT 702 (Vge) remains high due to a charge on the gate. The application of VO to transistor M results in a current Ig' generated by the current generator 710 that is then added to the gate current (Ig) across the resistor Rg 716. Therefore, the total turn-off gate current may be calculated as a sum of the parts, namely Ig-total=Ig+Ig'. The diode D1 of the current generator 710 prevents additional gate current during turn-on transients but this only applies if a single gate resistor 716 is used. If the turn-on and turn-off gate circuits for the power device 702 are separated, such as a turn-on resistor and a turn-off resistor, and Rg is only the turn-off gate resistance, D1 may be eliminated. Zener diode D2 is configured to prevent VO exceeding a gate limitation of the transistor M. When considering operation of the power device at low temperatures when the breakdown voltage (BV) is low, the temperature sensor output signal VT will be high and M gate signal VO will be low according to equation 1. A low VO may lead to a low Ig' and thus a low Ig-total. As Ig-total decreases, the rate of change of current (di/dt) during turn-off also decreases, and as a result the Vsurge as well as the peak voltage Vpeak is decreased. Therefore, the power device voltage breakdown in an extreme low temperature environment at which many xEVs operate may be avoided.

In general, logic circuit 708 provides a gate voltage (Vge) to MOSFET M of current driver 710. Current driver 710 generates an additional gate current (Ig') based on Vge. Considering a common MOSFET I-V curve, at low temperatures, a MOSFET drain current will be higher than it at high temperatures. Here a lower MOSFET drain current is needed at lower temperatures, therefore an adjustment of Ig' due to different temperatures comes from a different output of the temperature sensor 704 that in turn produces a different output of the current generator 710. Also, a different output of current generator 710 will produce a different level of additional gate current Ig' due to the MOSFET characteristics at different gate voltages. The logic circuit 708 may be configured to operate the current generator 710 in a variety of different regions. For example, the MOSFET M may be operated in a linear region or in a saturation region. To operate MOSFET M in the saturation region, the drain to source voltage (Vds) has to be greater than the gate to source voltage (Vgs)—the threshold voltage (Vth) or (Vgs-Vth). When the drain to source voltage (Vds) is greater, the MOSFET operates at substantially a constant current regardless of any change in Vds (as long as Vds>Vgs-Vth, while Vgs>Vt). An advantage of this operating region is the control of the additional gate current (Ig') is based on a gate to source voltage that (i.e., the output voltage of the gate driver 714 and the output voltage of the logic circuit 708). However, if the device is operated at low drain to source voltages (Vds), the device may fall into the linear region in which (Vds<Vgs-Vth, while Vgs>Vt). In the linear region, the drain current Id changes proportionally as Vds changes along a substantially linear line defined by Vgs-Vt. To control the additional gate current (Ig') when operating in the linear region, to accurately provide a given additional gate current (Ig'), the logic circuit 708 may need to predict a gate voltage of the power device 702 along with the output voltage of the gate driver 714 and the output voltage of the logic circuit 708 such that both Vds of MOSFET M and Vgs of MOSFET M may be controlled with respect to Vds of MOSFET M.

Similar to a MOSFET, a BJT may be used however, a BJT is a current controlled device while a MOSFET is a voltage controlled device. Thus, the logic circuit 708 may be configured to provide a given base current to a BJT M (in place of MOSFET M) and the collector current of the BJT would be the additional gate current (Ig'). In which the collector current is related to the base current by a gain of the BJT (Hfe) in the saturation region and at low collector to emitter voltages (Vce), the BJT operates in a linear region that is also based on Vce. Here, the resistive channel of the BJT is formed based on a base current. In both instances, a prediction (based on gate resistor Rg 718, and the output of gate driver 714) of the gate current may be used to determine the gate voltage of the power device 702 thus providing the voltage at the drain of MOSFET M or the collector of BJT M.

Figure 7B:
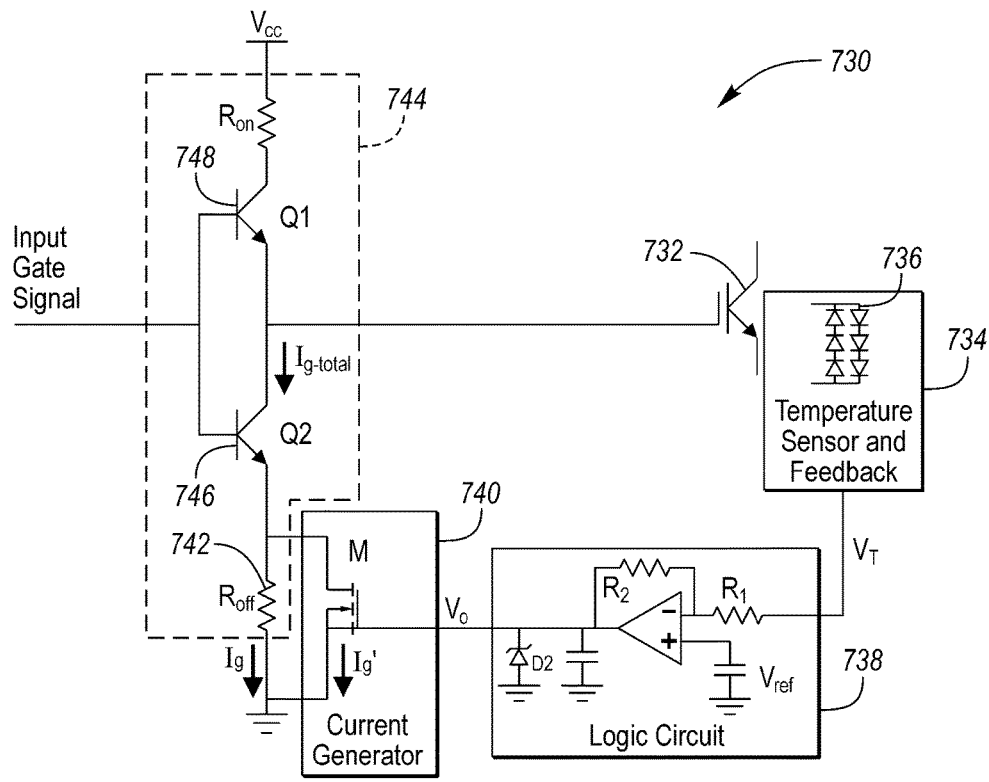
FIG. 7B is a second schematic diagram of a gate drive circuit having temperature compensation circuitry.

FIG. 7B is a second schematic diagram of an IGBT and a gate drive circuit 730 having temperature compensation circuitry. This embodiment is shown to be implemented using a traditional totem-pole structure gate driver 744, in this example BJTs are shown but other devices such as MOSFETs may be used. The current generator transistor M is paralleled with the turn-off resistor Roff and the D1 may be eliminated due to the OFF state of Q2 during turn-on transient. The circuit operation principle in FIG. 7B is similar to the circuit in FIG. 7A. An IGBT 732 is coupled with a temperature sensor 734 that is shown as a diode array 736. The temperature sensor 734 is configured to output a voltage signal (VT) based on a temperature, typically the junction temperature Tj, of the IGBT 732. The output voltage $V_T$ is received by a logic circuit 738 that may be used to buffer, filter, or process the raw signal from the temperature sensor 734, after the logic circuit 738 may outputs a signal to drive a current generator 740. The current generator 740 is coupled in parallel with the current limiting gate resistor 742 such that a total gate current flowing from the gate of the IGBT 732 is a sum of the current flowing through the gate resistor 742 ($I_g$) and the current flowing through the current generator 740 ($I_g'$). The totem-pole structure gate driver 744 includes a high-side switch 748 and a low-side switch 746. The high-side switch 748 has a pull-up current limiting resistor ($R_{on}$) and the low-side switch 746 has a pull-down current limiting resistor ($R_{off}$) 742. Here, the pull-down current limiting resistor ($R_{off}$) 742 is in parallel with a transistor (M) of the current generator 740. Like FIG. 7A, the gain of the operational amplifier of the logic circuit 738 may be expressed as $V_O$ equals $(R_2/R_1) \cdot V_T$, in which the ratio of $(R_2/R_1)$ is selected based on the characteristics of transistor M, the reference voltage $(V_{ref})$, and the interaction of the IGBT 732, the diode array 736, and a load current driven by the IGBT 732.

Figure 7C:
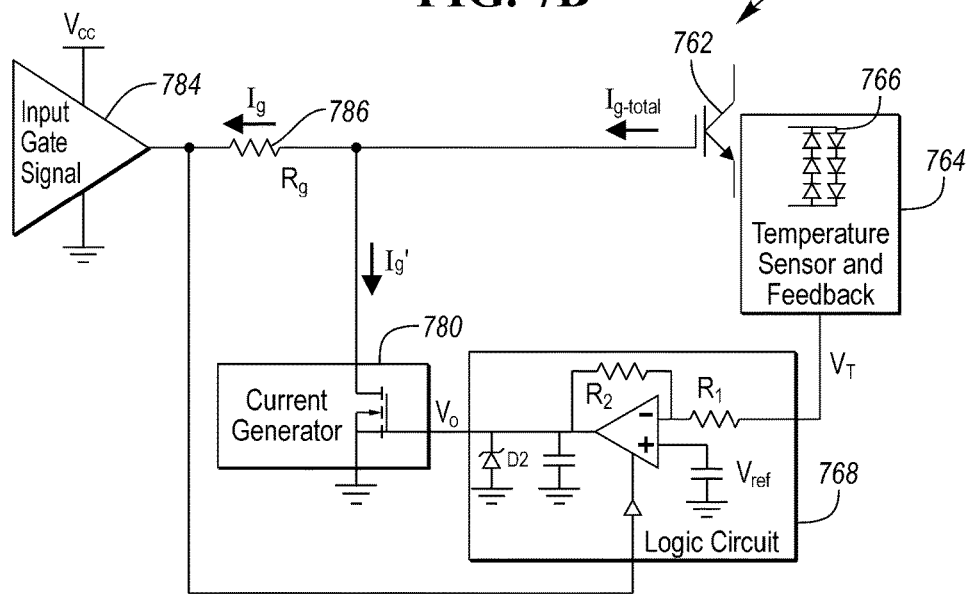
FIG. 7C is a third schematic diagram of a gate drive circuit having temperature compensation circuitry.

FIG. 7C is a third schematic diagram of a gate drive circuit 760 having temperature compensation circuitry. An IGBT 762 is coupled with a temperature sensor 764 that is shown as a diode array 766. The temperature sensor 764 is configured to output a voltage signal (VT) based on a temperature, associated with the junction temperature Tj, of the IGBT 762. The output voltage $V_T$ is received by a logic circuit 768 that may be used to buffer, filter, or process the raw signal from the temperature sensor 764, after the logic circuit 768 may outputs a signal to drive a current generator 780. The current generator 780 is coupled with the current limiting gate resistor 786 such that a total gate current flowing from the gate of the IGBT 762 is a sum of the current flowing through the gate resistor 786 ($I_g$) and the current flowing through the current generator 780 ($I_g'$). This gate driver is configured such that the gate driver 784 may be used to source or sink current from the gate of the IGBT 762 and that the logic circuit 768 may be enabled when the gate driver 784 is sinking current to turn the IGBT 762 off, and the logic circuit 768 may be disabled when the gate driver 784 is sourcing current to turn the IGBT on.

Figure 8:
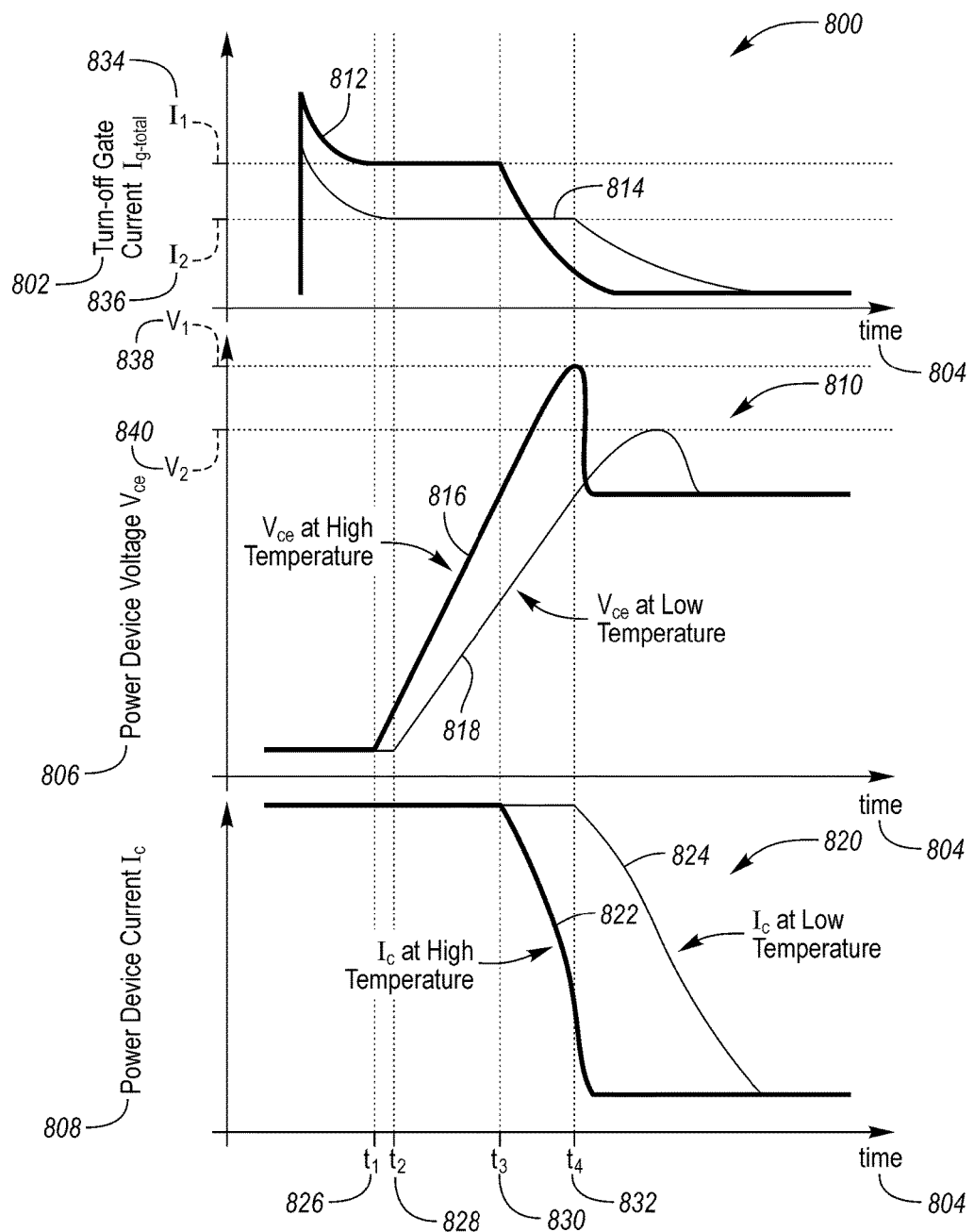
FIG. 8 is a graphical diagram of gate current, device voltage and device current of an IGBT with respect to time.

FIG. 8 is a graphical diagram of gate current 800, device voltage 810 and device current 820 of an IGBT with respect to time 804. Here, the effects of a proposed turn-off gate strategy for the power devices operated at low temperature and high temperature respectively are provided in a graphical view. First, a turn-off gate current 802 is shown with respect to time 804, next a power device voltage 806 is shown with respect to time 804, and finally a power device current 808 is shown with respect to time 804. The profile of a high-temperature turn-off gate current 812 is shown with respect to time 804 (e.g., 25, or 40° C.) along with a profile of a low-temperature turn-off gate current 814 with respect to time 804 (e.g., −25, or 0° C.). Using the proposed circuit, at high-temperatures, the gate current drains at a miller plateau current level ($I_1$) while at low temperatures, the gate current drains at a miller plateau current level ($I_2$) that is less than the miller plateau current level ($I_1$). The result is that the power device collector to emitter voltage ($V_{SE}$) at a high temperature 816 surges to a higher peak voltage ($V_1$) 838 than the low temperature $V_{CE}$ 818 that reaches a peak ($V_2$) 840 as the rate of change of voltage with respect to time 804 is greater at the high temperature than the rate of change with respect to time at the low temperature. Here, due to the lower gate effective resistance and higher gate current, charge is removed from the gate at an increased rate at the high temperature thereby having the power device exit a saturation mode quicker, shown here as time $T_1$ 826, and the power device exits the saturation mode at time $T_2$ 828 at the lower temperatures due to the reduced gate current.

Similarly, the power device collector current ($I_c$) at a high temperature 822 drops off fastest and at a quicker point in time ($T_3$) 830 than the low temperature $I_c$ 824 at the transition point ($T_4$) 832 as the rate of change of current with respect to time 804 is greater at the high temperature than the rate of change with respect to time at the low temperature. Here, due to the lower gate effective resistance and higher gate current, charge is removed from the gate at an increased rate at the high temperature thereby having the power device exit the miller plateau quicker, shown here as time $T_3$ 830, and the power device exits the miller plateau at time $T_4$ 832 at the lower temperatures due to the reduced gate current.

Advantages of this solution include lower switching losses with increased reliability while avoiding a power device voltage breakdown at low temperatures. This also may be accomplished with an adjustable temperature compensated turn-off gate driver. The adjustability accounts for a change in the breakdown voltage of the power devices for the xEVs even at extreme low operating temperatures (e.g. at −40° C.). However, when operating in a high temperature range, the system adjusts for the increased breakdown voltage of the selected power device as it is much higher than the low temperature requirement. A device with higher breakdown voltage typically has a higher conduction loss. By using the proposed adjustable turn-off gate drive based on the xEVs operation temperature, the device voltage peak is optimized within a wide temperature range. As a result, power devices with reduced voltage rating may be safely used for the same application thereby reducing conduction loss. Also, the proposed method uses an output of the temperature sensing diode which is already used for temperature monitoring and over temperature protection in xEVs. Therefore, additional sensing circuits/components are typically not needed. Lastly, the proposed method has minimum additional components to the existing gate drive schematics. As a result the proposed method can be used for any gate drive strategy including the voltage source gate drive, the current source gate drive, etc., and the original gate drive function will not be affected.

As shown above, at high operation temperatures the proposed system may increase the turn-off speed and reduce the turn-off losses. As most of an xEV is operated in this range, the power devices in xEVs will work at these high temperature range, thereby improving fuel economy of the vehicle.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle powertrain comprising:
   a switch configured to provide a current to an electric machine and coupled with a diode array; and
   a gate driver configured to, in response to a voltage across the array exceeding a threshold in a presence of a turn-off request, confine operation of a resistive device, parallel with a switch gate resistor, to a saturation region to decrease a rate of change of the current proportional to the voltage.

2. The vehicle powertrain of claim 1, wherein the rate of change of the current is based on a resistance of a turn-off resistor in series with a gate of the switch and the resistive device is coupled in parallel with the turn-off resistor.

3. The vehicle powertrain of claim 2, wherein the rate of change of the current is further based on a predicted voltage of the gate of the switch.

4. The vehicle powertrain of claim 2, wherein the resistive device is a Metal Oxide Semiconductor Field Effect Transistor (MOSFET) or a Bipolar Junction Transistor (BJT).

5. The vehicle powertrain of claim 2, wherein the switch is a Metal Oxide Semiconductor Field Effect Transistor (MOSFET) or an Insulated Gate Bipolar Junction Transistor (IGBT).

6. The vehicle powertrain of claim 1, wherein the switch and diode array are monolithically integrated.

7. The vehicle powertrain of claim 1, wherein the resistive device is disabled when the gate driver outputs a turn-on signal.

8. A method of controlling an Insulated Gate Bipolar Junction Transistor (IGBT) comprising:
   in response to voltage across a diode array, coupled with the IGBT exceeding a threshold while providing a drive current in a presence of a turn-off request for the IGBT, limiting operation of a resistive device that is electrically in parallel with a gate resistor for the IGBT to a saturation region to reduce a rate of change of the drive current.

9. The method of claim 8, wherein the rate of change of the drive current is proportional to a rate of change of the voltage.

10. The method of claim 9, wherein the rate of change of the drive current is further based on a predicted voltage of a gate of the IGBT.

11. The method of claim 8, wherein the resistive device is a Metal Oxide Semiconductor Field Effect Transistor (MOSFET), and operating a resistive device to pass a current in a range includes operating the resistive device to pass a current in a range based on a gate voltage applied to the MOSFET.

12. The method of claim 8, wherein the resistive device is a Bipolar Junction Transistor (BJT), and operating a resistive device to pass a current in a range includes operating the resistive device to pass a current in a range based on a base current flowing into the BJT.

13. The method of claim 8, wherein operating a resistive device to pass a current in a range includes operating the resistive device to pass a current in a range that is based on a predicted gate voltage of the IGBT.

14. A vehicle comprising:
   a power converter including a power switch; and
   a gate driver configured to, in response to a voltage across a diode array, coupled with the power switch, dropping below a threshold while providing a current to a load in a presence of a turn-off request, transition a resistive device from a linear region to a saturation region to selectively increase a rate of change of the current proportional to the voltage.

15. The vehicle of claim 14, wherein the power converter is a DC-AC converter and the load is an electric machine configured to provide propulsive force to the vehicle.

16. The vehicle of claim 14, wherein the power converter is a DC-DC converter and the load is a boost inductor.

17. The vehicle of claim 14, wherein the rate of change of the current is proportional to a rate of change of the voltage.

18. The vehicle of claim 14, wherein the rate of change of the current is further based on a predicted voltage of a gate of the switch.

19. The vehicle of claim 14, wherein the rate of change of the current is based on a resistance of a turn-off resistor in series with a gate of the switch and the resistive device is coupled in parallel with the turn-off resistor.

20. The vehicle of claim 14, wherein the resistive device is disabled when the gate driver outputs a turn-on signal.

* * * * *